United States Patent [19]
Greene et al.

[11] Patent Number: 5,861,190
[45] Date of Patent: *Jan. 19, 1999

[54] ARRANGEMENT FOR GROWING A THIN DIELECTRIC LAYER ON A SEMICONDUCTOR WAFER AT LOW TEMPERATURES

[75] Inventors: Wayne M. Greene; Michael B. Cox, both of Los Gatos; Frank Perlaki, Palo Alto; Elizabeth C. Carr, Sunnyvale, all of Calif.

[73] Assignee: Hewlett-Packard Co., Palo Alto, Calif.

[*] Notice: This patent issued on a continued prosecution application filed under 37 CFR 1.53(d), and is subject to the twenty year patent term provisions of 35 U.S.C. 154(a)(2).

[21] Appl. No.: 621,410

[22] Filed: Mar. 25, 1996

[51] Int. Cl.$^6$ .......................... C23C 16/02; C23C 16/46; C23C 16/22

[52] U.S. Cl. .................................. 427/248.1; 427/255.3; 427/255.4; 427/399; 427/561; 427/579

[58] Field of Search ............................. 427/248.1, 255.3, 427/255.4, 399, 579, 561, 563

[56] References Cited

U.S. PATENT DOCUMENTS

| | | | |
|---|---|---|---|
| 4,526,805 | 7/1985 | Yoshizawa | 427/38 |
| 4,624,859 | 11/1986 | Akira et al. | 427/38 |
| 4,810,673 | 3/1989 | Freeman | 437/239 |
| 5,040,046 | 8/1991 | Chhabra et al. | 357/54 |
| 5,225,378 | 7/1993 | Ushikawa | 437/233 |
| 5,468,688 | 11/1995 | Kohl et al. | 437/237 |
| 5,554,418 | 9/1996 | Ito et al. | 427/579 |

FOREIGN PATENT DOCUMENTS

95/16801   6/1995   WIPO .

OTHER PUBLICATIONS

Zaima et al., "Growth and Properties of Dielectric Thin Films by Microwave–Excited Plasma", 1986, pp. 249–252, JP J. of Applied Phys.; Supplements (18th Int. Conf. on Solid State Devices & Materials, Tokyo).

Hoff et al. "Thermal Oxidation of Silicon in an Afterglow CAS", 1988, pp. 336–337, 1046B Extended Abstracts/ Spring Meeting 88–1 (1988) May 15–20, Princeton, NY USA.

Bhat, M. et al., "MOS Characteristics of Ultrathin No–Grown Oxynitrides", IEEE Electron Device Letters, vol. 15, No. 10, Oct. 1994, pp. 421–423.

Okada, Y. et al., "Gate Oxynitride Grown in Nitric Oxide (NO)", 1994 Symposium On VLSI Technology Digest Of Technical Papers, 1994, pp. 105–106.

Tobin, P.J. et al., Furnace formation of silicon oxynitride thin dielectrics in nitrous oxide (N20): The role of nitric oxide (NO), J. Appl. Phys., vol. 75, No. 3, Feb. 1, 1994, pp. 1811–1816.

*Primary Examiner*—Shrive Beck
*Assistant Examiner*—Michael Barr
*Attorney, Agent, or Firm*—Thomas X. Li

[57] ABSTRACT

A process of growing a dielectric layer includes a step of heating a gas mixture of at least one gas having a first chemical element of oxygen and a second chemical element other than oxygen to a first predetermined temperature to produce reactive precursors of the gas mixture. The reactive precursors are then introduced into a reaction chamber that houses at least one wafer to grow the dielectric layer on the wafer within the reaction chamber at a second predetermined temperature below the first predetermined temperature. A semiconductor manufacturing apparatus of growing the dielectric layer is also described.

8 Claims, 3 Drawing Sheets

ARRANGEMENT FOR GROWING A THIN DIELECTRIC LAYER ON A SEMICONDUCTOR WAFER AT LOW TEMPERATURES

BACKGROUND OF THE INVENTION

1. Field of the Invention

The present invention pertains to integrated circuit fabrication. More particularly, this invention relates to an arrangement for growing, at low temperatures, a thin dielectric layer with maximized reliability, maximized resistance to boron penetration, maximized immunity to hot carriers and/or plasma damage, and better thickness control.

2. Description of the Related Art

It has been known that introducing nitrogen into a wafer oxidation process can grow a silicon oxynitride dielectric layer on the wafer. This process of growing an oxynitride layer is typically referred to as oxynitridation process. The oxynitride layer can be relatively thin and typically has a relatively high reliability with respect to the dielectric breakdown. In addition, the oxynitride layer can provide relatively high resistance to boron penetration and relatively high immunity to hot carriers and/or plasma damage. Moreover, the oxynitridation process typically increases thickness control of the dielectric layer.

One prior art technique of accomplishing the oxynitridation process to grow an oxynitride dielectric layer on a semiconductor wafer is through the use of a conventional single-chamber (or tube) furnace, which is shown in FIG. 1. As can be seen from FIG. 1, a reaction system 10 includes a manifold 11 that receives reaction gaseous species containing the chemical elements of nitrogen and oxygen (such as $N_2O$, $NO$, $NO_2$, and $NO_3$) through pipes 13 through 15. The manifold 11 mixes the reaction gases and then feed the mixed gases to a reaction chamber 12 of the reaction system 10 via a pipe 16. The reaction chamber 12 houses at least one wafer (not shown in FIG. 1) for oxynitridation. The reaction chamber 12 is typically a vacuum chamber or tube. The vacuum is provided by a pump (not shown in FIG. 1) via an exhaust pipe 17. The reaction chamber 12 is heated by a furnace (not shown) to an elevated temperature of approximately 1000° C. at which the gases react or decompose due to the heat in the reaction chamber 12. The decomposed gases are then deposited on the surface of the wafer to form the oxynitride layer. The process typically takes place inside the reaction chamber 12 at atmospheric pressure.

Disadvantages are, however, associated with this prior art oxynitridation technique. One disadvantage associated is that the reaction temperature of the reaction chamber 12 is typically relatively high (e.g., about 1000° C.). The relatively high temperature is needed in order for the gases to react or decompose. This relatively high temperature, however, typically causes undesirable dopant diffusion to occur on the wafer. This is due to the fact that dopant diffuision typically occurs when the temperature of the wafer (i.e., wafer temperature or substrate temperature) exceeds approximately 800° C. The undesirable dopant diffusion is unacceptable and unwanted because it changes the electrical properties of the wafer. However, it is equally unacceptable if the reaction temperature of the reaction chamber 12 is below 850° C. to grow the oxynitride layer. When the temperature of the reaction chamber 12 is below 850° C., the gaseous species containing the chemical elements of oxygen and nitrogen do not react with each other or do not decompose and the oxynitridation process cannot take place.

SUMMARY OF THE INVENTION

One of the features of the present invention is to grow a dielectric layer on a semiconductor wafer with minimized thickness, maximized reliability, maximized resistance to boron penetration, maximized immunity to hot carriers and/or plasma damage, and better thickness control.

Another feature of the present invention is to grow the above-mentioned dielectric layer by incorporating nitrogen or other chemical elements into the dielectric layer.

A further feature of the present invention is to allow incorporation of nitrogen or other chemical elements into the dielectric layer at relatively low temperatures.

A still further feature of the present invention is to allow fabrication of an improved transistor with relatively low threshold voltage and leakage current levels.

Below described is a process and apparatus of growing a dielectric layer. A pre-reaction chamber is used to heat reaction gas mixture containing the chemical element of oxygen and a chemical element other than oxygen up to an elevated temperature. The pre-reaction chamber does not house any wafer. At the elevated temperature, the reaction gas mixture reacts or thermally decomposes to generate reactive precursors. The reactive precursors are then fed to a reaction chamber to grow a dielectric layer on a wafer in the reaction chamber at a reaction temperature substantially lower than the elevated temperature. By allowing the gas reaction and dielectric growth to occur in different chambers, the dielectric growth (e.g., oxynitridation) process can occur at relatively low temperatures.

BRIEF DESCRIPTION OF THE DRAWINGS

The present invention is illustrated by way of example and not by way of limitation in the figures of the accompanying drawings, in which like references indicate similar elements, and in which.

DETAILED DESCRIPTION OF THE INVENTION

Figure 1:
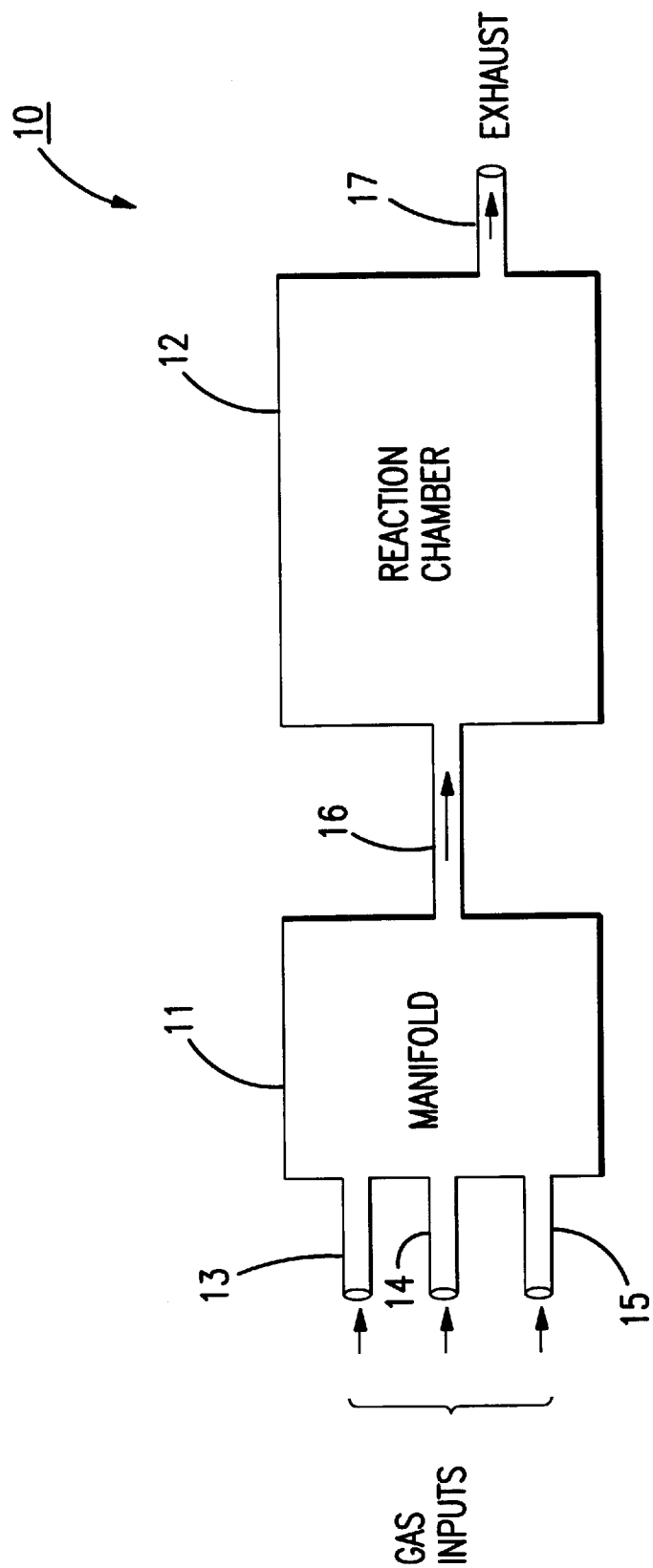
FIG. 1 shows a prior art arrangement of growing an oxynitride dielectric layer.
Figure 2:
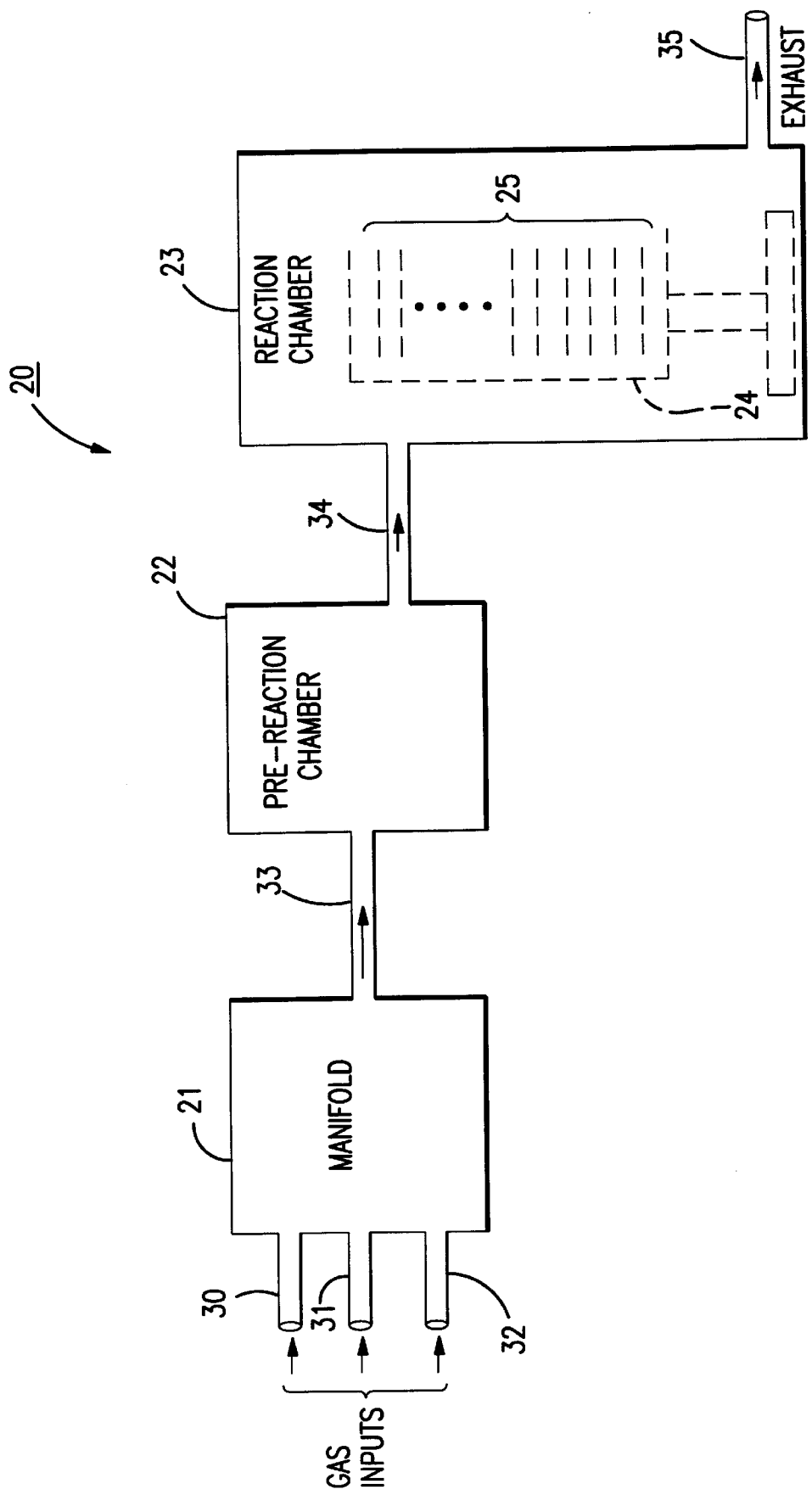
FIG. 2 shows an arrangement of growing a dielectric layer in accordance with one embodiment of the present invention.

FIG. 2 illustrates a reaction system 20 for forming or growing an oxynitride layer or other dielectric layer on a semiconductor wafer at low wafer or substrate temperatures in accordance with one embodiment of the present invention. As can be seen from FIG. 2, the reaction system 20 includes a pre-reaction chamber 22 and a reaction chamber 23. The reaction chamber 23 includes a wafer holder 24 that holds a number of semiconductor wafers 25 (i.e., at least one wafer) to be deposited with the oxynitride or other dielectric layer.

Briefly, the reaction system 20 allows introduction of nitrogen or other chemical elements into an oxide (or other dielectric) layer at a temperature equal to or lower than a maximum desirable wafer or substrate temperature (e.g., approximately 850° C.). The maximum desirable wafer temperature is the maximum temperature at which the wafer can be properly processed without having much undesirable dopant diffusion. The reaction system 20 accomplishes this by causing reaction gaseous species containing the chemical elements of oxygen and nitrogen (or other chemical elements) to be first introduced into the pre-reaction chamber 22. The pre-reaction chamber 22 is then heated to an elevated temperature (e.g., approximately 950° C.–1000° C.) which is substantially higher than the maximum desirable wafer temperature. At the elevated temperature, the reaction gas or gases react or thermally decompose to generate reactive precursors of the reaction gas or gases. The reactive precursors are then fed to the reaction chamber 23 to grow an oxynitride or other dielectric layer on each of the wafers 25 at or below the maximum desirable wafer temperature. Alternatively, the reactive precursors can be fed to the reaction chamber 23 to treat an already grown oxide layer such that an oxynitride layer is formed. By allowing the gas reaction and dielectric growth to occur in different chambers, the dielectric growth (e.g., oxynitridation) process can occur at a temperature lower than the temperature at which the reaction gas mixture reacts. This low temperature dielectric growth process allows for design and fabrication of an improved transistor with low threshold voltage and low leakage levels.

In one embodiment, the maximum desirable wafer temperature is approximately 850° C. In another embodiment, the maximum desirable wafer temperature is approximately 800° C. Alternatively, the maximum desirable wafer temperature can be higher or lower than 850° C. or 800° C., depending on the material of the wafer, the pressure within the reaction chamber 23, or the processing time of the wafers 25.

As can be seen from FIG. 2 and in one embodiment, the wafer holder 24 holds the wafers 25 inside the reaction chamber 23 horizontally. In another embodiment, the wafer holder 24 can be a vertical wafer holder that holds the wafers 25 vertically within the reaction chamber 23. Alternatively, the wafer holder 24 can be any other known wafer holder.

In one embodiment, each of the wafers 25 is a silicon wafer. In another embodiment, each of the wafers 25 is a gallium arsenide (GaAs) wafer. Alternatively, each of the wafers 25 can be a group III–V semiconductor wafer or a group IV semiconductor (e.g., poly-silicon or tungsten silicide) wafer. The reaction chamber 23 is a vacuum chamber which is exhausted by a vacuum pump (not shown in FIG. 2) via an exhaust pipe 35. The reaction chamber 23 is used to grow the oxynitride or other dielectric layer on each of the wafers 25 at low wafer temperatures. As described above, the reaction chamber 23 does this by receiving the reactive precursors from the pre-reaction chamber 22, instead of receiving the reaction gas or gases directly.

In one embodiment, the oxynitride layer is directly grown on each of the wafers 25 in the reaction chamber 23. In another embodiment, the oxynitride layer is formed on each of the wafers 25 by first forming an oxide layer on each of the wafers 25 and then treating the oxide layer with the reactive precursors to form or grow the oxynitride layer.

The reaction chamber 23 can be implemented by any known reaction chamber or tube. In one embodiment, the reaction chamber 23 is a furnace reaction chamber or tube. In another embodiment, the reaction chamber 23 is a rapid thermal processing chamber or tube.

When the reaction chamber 23 is a rapid thermal processing chamber, the reaction chamber 23 houses one wafer for processing at one time. When this occurs, the wafer holder 24 holds only one wafer inside the reaction chamber 23. When the reaction chamber 23 is a furnace reaction chamber, the reaction chamber 23 houses one or more than one wafer for processing at one time.

In one embodiment, the reaction pressure of the reaction chamber 23 is approximately one atmosphere. Alternatively, the reaction pressure of the reaction chamber 23 is higher or lower than one atmosphere.

The pre-reaction chamber 22 is connected to the reaction chamber 23 via a pipe 34. The reactive precursors are introduced to the reaction chamber 23 from the pre-reaction chamber 22. The reactive precursors are generated or produced in the pre-reaction chamber 22 by heating the reaction gas or gases inside the pre-reaction chamber 22 to the elevated temperature. The pre-reaction chamber 22 receives the reaction gas or gases from a manifold 21. As can be seen from FIG. 2, the pre-reaction chamber 22 does not house any wafer.

In one embodiment, the elevated temperature of the pre-reaction chamber 22 is approximately 950° C. In another embodiment, the elevated temperature of the pre-reaction chamber 22 is approximately 1000° C. Alternatively, the elevated temperature can be within the range of 850° C. and 1200° C. Furthermore, the elevated temperature can be any temperature that is higher than the reaction temperature.

In one embodiment, the reaction temperature of the reaction chamber 23 is within the range of 700° C. and 850° C. In another embodiment, the reaction temperature is approximately 700° C. In a further embodiment, the reaction temperature is approximately 800°0 C. Alternatively, the reaction temperature can be lower than 700° C. or higher than 850° C. The reaction temperature is, however, always below the elevated temperature of the pre-reaction chamber 22.

The pre-reaction chamber 22 can also be implemented by any known means. In one embodiment, the pre-reaction chamber 22 is a furnace chamber or tube. In another embodiment, the pre-reaction chamber 22 can simply be a tube or pipe with an internal hot filament for heating the gases. In a further embodiment, the pre-reaction chamber 23 is a reaction chamber containing a plasma. In addition, the pressure within the pre-reaction chamber 22 can be one atmospheric pressure or higher or lower than one atmosphere.

The manifold 21 is used to mix the reaction gas or gases supplied from pipes 30–32. The manifold 21 then sends the mixed gases to the pre-reaction chamber 22. Alternatively, the reaction system 20 may not include the manifold 21. In that case, the reaction gases are directly fed to the pre-reaction chamber 22. Moreover, the manifold 21 is not included in the reaction system 20 when the pre-reaction chamber 22 only receives one reaction gas. In addition, although FIG. 2 shows three gas input pipes 30–32, the present invention is not limited to just three gas pipes and more or fewer gas pipes may be employed.

In FIG. 2, the reaction gases supplied to the manifold 21 can be introduced as dry gases or in vapor form. The reaction gas or gases contain the chemical elements of oxygen and another chemical element. In one embodiment, the other chemical element is nitrogen. In this case, the dielectric layer grown or developed on each wafer in the reaction chamber 23 is an oxynitride layer. In other embodiments, the other chemical element employed can be fluorine, chlorine, or carbon. Alternatively, other chemical elements can also be used. The present invention will be described in more detail below, using nitrogen as an example.

As described above, in order to grow an oxynitride layer on a wafer, gaseous species containing the elements of oxygen and nitrogen are introduced to the manifold 21. Those gaseous species include, for example, $N_2O$, $NO$, $NO_2$, and NO₃ gases. The gases are then mixed in the manifold 21 and fed to the pre-reaction chamber 22 via the pipe 33.

Once introduced inside the pre-reaction chamber 22, the gases are heated to the elevated temperature (i.e., the pre-reaction temperature) such that they react or decompose to generate the reactive precursors. The reactive precursors containing the elements of oxygen and nitrogen are then introduced to the reaction chamber 23 to be deposited on each of the wafers 25 at a reaction temperature substantially lower than the elevated pre-reaction temperature. By doing so, a thin oxynitride layer is formed on a wafer at a low wafer temperature. As described above, high wafer temperature (i.e., above 850° C.) may cause undesirable dopant diffuision to occur on the wafer, which typically alters the electrical properties of the wafer or even damages the wafer.

As described above, the oxynitride layer can be either directly grown on each of the wafers 25 in the reaction chamber 23 using the reactive precursors at the relatively low temperature or grown on each of the wafers 25 in the reaction chamber 23 by treating an already grown oxide layer on each of the wafers 25 with the reactive precursors which contain the chemical element of nitrogen. In other words, the oxynitridation process can be an independent process to form the oxynitride layer, or can be used as a treatment step of a dielectric growth process.

Figure 3:
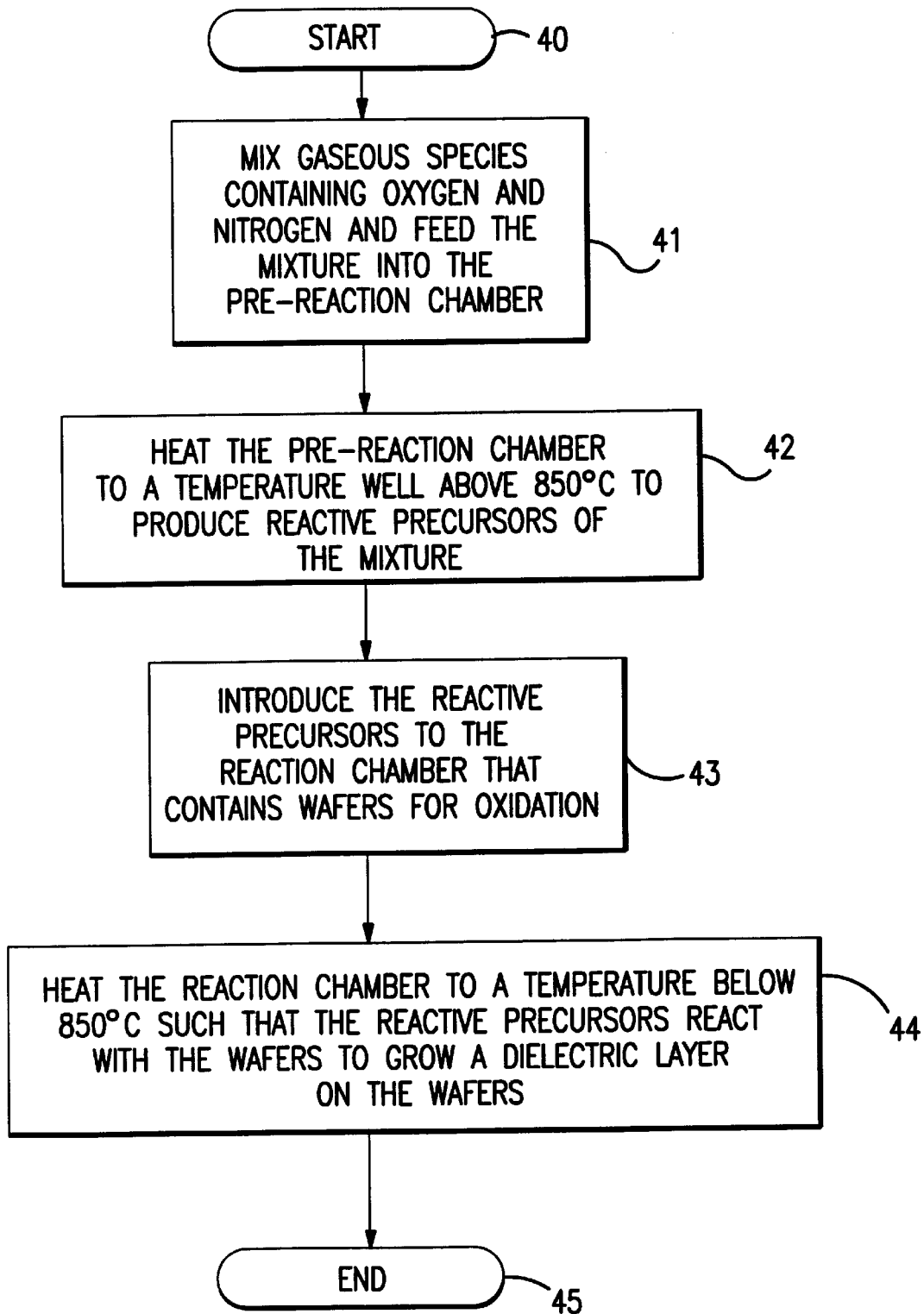
FIG. 3 is a flow chart diagram illustrating the process of growing the dielectric layer in accordance with one embodiment of the present invention.

FIG. 3 illustrates in flow chart diagram form the process carried out by the reaction system 20 of FIG. 2 to grow, as an example, an oxynitride layer at low temperatures in accordance with one embodiment of the present invention. As can be seen from FIG. 3, the process starts at step 40. At step 41, the gas or gases that include the chemical elements of oxygen and nitrogen are mixed and introduced into the pre-reaction chamber 22 of FIG. 2. At step 42, the mixed gases in the pre-reaction chamber 22 are heated to an elevated temperature above 850° C. to produce the reactive precursors. As described above, the elevated temperature is approximately within the range of 950° C. and 1000° C. in order to produce the reactive precursors. The reactive precursors are then introduced to the reaction chamber 23 (FIG. 2) at step 43. As can be seen from FIG. 2, the wafers 25 are housed inside the reaction chamber 23. At step 44, the reaction chamber 23 is heated to a reaction temperature below the elevated pre-reaction temperature (i.e., below 850° C.) to directly grow the oxynitride layer with the reactive precursors, or to grow the oxynitride layer by treating an already-formed oxide layer with reactive precursors. As described above, the reaction temperature is approximately within the range of 700° C. and 850° C. The process then ends at step 45.

In the foregoing specification, the invention has been described with reference to specific embodiments thereof. It will, however, be evident to those skilled in the art that various modifications and changes may be made thereto without departing from the broader spirit and scope of the invention. The specification and drawings are, accordingly, to be regarded in an illustrative rather than a restrictive sense.

What is claimed is:

1. A process of growing a dielectric layer, comprising the steps of:
   (A) heating at least one gas having a first chemical element of oxygen and a second chemical element of nitrogen to a first predetermined temperature which is approximately within 950° C. and 1000° C. to produce reactive precursors from the gas;
   (B) introducing the reactive precursors into a reaction chamber that houses at least one wafer, wherein the reaction chamber and said at least one wafer are maintained at a second predetermined temperature which is approximately within 700° C. and 850° C.;
   (C) growing the dielectric layer on the wafer within the reaction chamber at the second predetermined temperature, by reacting the reactive precursors with said at least one wafer, wherein the reaction chamber is a vertical or horizontal diffusion chamber and the dielectric layer is grown at substantially atmospheric pressure.

2. The process of claim 1, wherein the first predetermined temperature is approximately 1000° C. at which chemical reaction occurs with respect to the gas.

3. The process of claim 1, wherein the reaction chamber is a rapid thermal processor.

4. The process of claim 1, wherein the step (A) further comprises the steps of:
   (I) introducing the gas into a pre-reaction chamber;
   (II) heating the pre-reaction chamber to the first predetermined temperature to produce the reactive precursors.

5. The process of claim 1, further comprising the step of forming an oxide layer on the wafer prior to the step (A) such that the dielectric layer is formed on the wafer at the step (C) by treating the oxide layer with the reactive precursors.

6. A process of growing a dielectric layer, comprising the steps of:
   (A) heating at least one gas having a first chemical element of oxygen and a second chemical element nitrogen to an elevated temperature of approximately 1000° C. at which chemical reaction occurs with respect to the gas to produce reactive precursors from the gas;
   (B) introducing the reactive precursors into a reaction chamber that houses at least one wafer, wherein the reaction chamber and said at least one wafer are maintained at a predetermined temperature that is approximately within a range of 700° C. to 850° C.;
   (C) growing the dielectric layer on the wafer within the reaction chamber at the predetermined temperature, by reacting the reactive precursors with said at least one wafer, wherein the reaction chamber is a vertical or horizontal diffusion chamber and the dielectric layer is grown at substantially atmospheric pressure.

7. The process of claim 6, wherein the step (A) further comprises the steps of:
   (I) introducing the gas into a pre-reaction chamber;
   (II) heating the pre-reaction chamber to the elevated temperature to produce the reactive precursors.

8. The process of claim 6, further comprising the step of forming an oxide layer on the wafer prior to the step (A) such that the dielectric layer is formed on the wafer at the by treating the oxide layer with the reactive precursors.

* * * * *